United States Patent
Yamazaki et al.

(10) Patent No.: US 9,256,334 B2
(45) Date of Patent: Feb. 9, 2016

(54) INJECTION MOLDED PRODUCT AND METHOD OF MANUFACTURING THE SAME

(71) Applicant: NISSHA PRINTING CO., LTD., Kyoto-shi, Kyoto (JP)

(72) Inventors: Seiichi Yamazaki, Kyoto (JP); Toshihiro Higashikawa, Kyoto (JP); Tomohiro Matsuzaki, Kyoto (JP); Masahiko Kariya, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 0 days.

(21) Appl. No.: 14/403,971

(22) PCT Filed: May 28, 2013

(86) PCT No.: PCT/JP2013/064784
§ 371 (c)(1),
(2) Date: Nov. 25, 2014

(87) PCT Pub. No.: WO2013/180132
PCT Pub. Date: Dec. 5, 2013

(65) Prior Publication Data
US 2015/0103503 A1   Apr. 16, 2015

(30) Foreign Application Priority Data
May 30, 2012  (JP) ................. 2012-123261

(51) Int. Cl.
*H05K 7/02* (2006.01)
*G06F 3/044* (2006.01)
(Continued)

(52) U.S. Cl.
CPC .......... *G06F 3/044* (2013.01); *B29C 45/14065* (2013.01); *B29C 45/14467* (2013.01);
(Continued)

(58) Field of Classification Search
CPC ................................ H05K 7/02; H05K 3/101
See application file for complete search history.

(56) References Cited

U.S. PATENT DOCUMENTS 4,110,904 A * 9/1978 Johnson ......................... 29/827
5,135,694 A   8/1992 Akahane et al.
(Continued)

FOREIGN PATENT DOCUMENTS

JP   2000-135741 A   5/2000
JP   2000-309773 A   11/2000
(Continued)

OTHER PUBLICATIONS

International Search Report in PCT/JP2013/064784 dated Sep. 3, 2013.

*Primary Examiner* — Hoa C Nguyen
*Assistant Examiner* — Xanthia C Cunningham
(74) *Attorney, Agent, or Firm* — Global IP Counselors, LLP

(57) ABSTRACT

An injection molded product in which an electrical connection between a contact pin and an electrode pattern is sufficient, and a method of manufacturing the same, are provided. The injection molded product comprises: a base film; an electrode pattern, which is formed on the base film; an electrically conductive adhesive, which is formed on an upper surface of the electrode pattern; a contact pin, which contacts the electrically conductive adhesive, is electrically connected to the electrode pattern via the electrically conductive adhesive, and is electrically conductive; and a molded resin, which is injection molded along the base film such that the electrically conductive adhesive and part of the contact pin are embedded.

14 Claims, 7 Drawing Sheets

(51) Int. Cl.

| | | |
|---|---|---|
| *H01R 4/04* | (2006.01) | |
| *H01Q 1/40* | (2006.01) | |
| *H01R 43/24* | (2006.01) | |
| *H01Q 1/24* | (2006.01) | |
| *B29C 45/14* | (2006.01) | |
| *H05K 3/10* | (2006.01) | |
| *G06F 1/16* | (2006.01) | |
| *H05K 3/00* | (2006.01) | |
| *H05K 3/40* | (2006.01) | |
| *B29L 31/34* | (2006.01) | |
| *H05K 1/02* | (2006.01) | |

(52) U.S. Cl.
CPC ............ *B29C45/14639* (2013.01); *G06F 1/16* (2013.01); *H01Q 1/243* (2013.01); *H01Q 1/40* (2013.01); *H01R 4/04* (2013.01); *H01R 43/24* (2013.01); *H05K 3/0014* (2013.01); *H05K 3/101* (2013.01); *H05K 3/4015* (2013.01); *H05K 7/02* (2013.01); *B29C 2045/14114* (2013.01); *B29L 2031/3437* (2013.01); *B29L 2031/3481* (2013.01); *G06F 2203/04112* (2013.01); *H05K 1/0284* (2013.01); *H05K 2201/0999* (2013.01); *H05K 2201/09118* (2013.01); *H05K 2201/10318* (2013.01)

(56) References Cited

U.S. PATENT DOCUMENTS

| | | | |
|---|---|---|---|
| 5,846,470 A | * | 12/1998 | Funatsu ................. B29C 45/14 |
| | | | 264/271.1 |
| 6,169,323 B1 | * | 1/2001 | Sakamoto ..................... 257/667 |
| 6,368,701 B1 | * | 4/2002 | Nomura ................ B29C 44/586 |
| | | | 428/218 |
| 2008/0257706 A1 | | 10/2008 | Haag |
| 2009/0090001 A1 | * | 4/2009 | Taniguchi et al. .............. 29/832 |
| 2009/0108985 A1 | | 4/2009 | Haag et al. |
| 2010/0220028 A1 | | 9/2010 | Cho et al. |
| 2012/0223805 A1 | | 9/2012 | Haag et al. |

FOREIGN PATENT DOCUMENTS

| | | | |
|---|---|---|---|
| JP | 2001-162644 A | | 6/2001 |
| JP | 2001162644 A | * | 6/2001 |
| JP | 2004-039960 A | | 2/2004 |
| JP | 2004-050488 A | | 2/2004 |
| JP | 2006-327151 A | | 12/2006 |
| JP | 2009-066916 A | | 4/2009 |
| JP | 2010-206792 A | | 9/2010 |
| JP | 2012-254564 A | | 12/2012 |

* cited by examiner

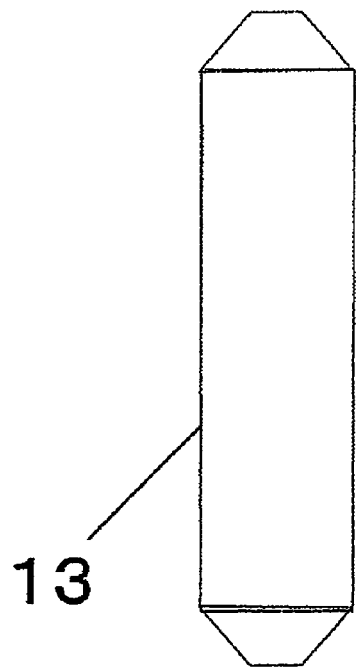
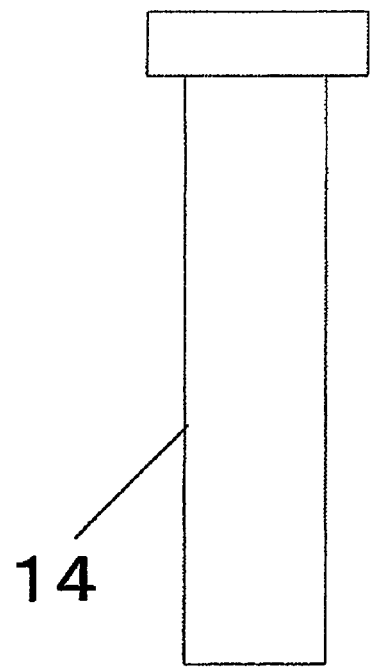
FIG. 5A  FIG. 5B
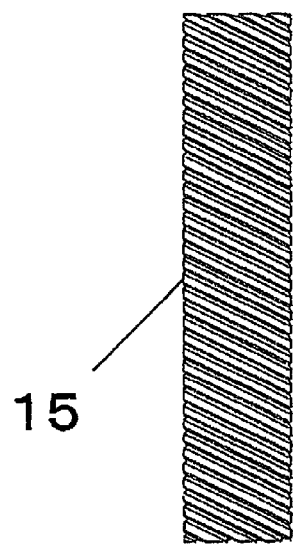
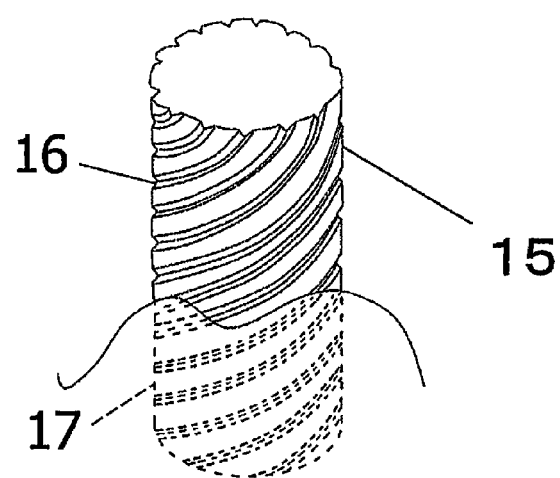
FIG. 6A  FIG. 6B

INJECTION MOLDED PRODUCT AND METHOD OF MANUFACTURING THE SAME

CROSS-REFERENCE TO RELATED APPLICATION

This U.S. National stage application claims priority under 35 U.S.C. §119(a) to Japanese Patent Application No. 2012-123261, filed in Japan on May 30, 2012, the entire contents of Japanese Patent Application No. 2012-123261 are hereby incorporated herein by reference.

BACKGROUND

1. Field of the Invention

The present invention relates to an injection molded product that electrically connects a contact pin and an electrode pattern, and to a method of manufacturing the same. The present invention particularly relates to an injection molded product that electrically connects a contact pin and an electrode pattern using an electrically conductive adhesive, and to a method of manufacturing the same.

2. Background Information

As a method of electrically connecting a contact pin and an electrode pattern, the conventional art includes insert molding. In insert molding, an electrode pattern is provided on a base film and the electrode pattern and the contact pin are brought into contact beforehand, after which the base film, the electrode pattern, and the contact pin are covered with a molded resin, which is then cooled and solidified, thereby electrically connecting the contact pin and the electrode pattern.

In addition, another method of electrically connecting a contact pin and an electrode pattern is outsert molding. In outsert molding, a base film and an electrode pattern are covered with a molded resin such that a hole that reaches the electrode pattern is formed, an electrically conductive adhesive is injected into the hole, after which the contact pin is inserted therein, thereby electrically connecting the electrode pattern and the contact pin. An example of a conventional method is described in Japanese Unexamined Patent Applicatioin Publication No. 2010-206792.

SUMMARY

In conventional insert molding, there are cases wherein the electrical connection between the contact pin and the electrode pattern is insufficient and therefore the electrical connection cannot be reliably made, which is a problem.

Moreover, although outsert molding can make an electrical connection more reliably than conventional insert molding can, the electrically conductive adhesive must be injected prior to the insertion of the contact pin into the hole. However, because the electrically conductive adhesive is injected into the bottom part of the hole, the solvent in the electrically conductive adhesive tends not to volatilize; therefore, because it takes time for the adhesive to dry and harden, the base film dissolves or swells owing to the action of the solvent, which creates abnormalities in the external appearance. In addition, to inject the electrically conductive adhesive into the hole, the hole diameter must be larger than the diameter of a tip needle of a dispenser; however, if the hole diameter is increased, there are cases in which a location corresponding to a portion of the hole appears to swell owing to a shrinkage differential between the base film and the molded resin at a peripheral part of the hole; in terms of the external appearance, too, there is a risk that users will no longer identify with the product. Furthermore, there are cases wherein, when the contact pin is inserted into the hole provided in the molded resin, the contact pin is pushed directly against the electrode pattern, and consequently a pin trace remains on the electrode pattern and the thin base film. In addition, there are problems in that, for example, the electrode pattern tears owing to the contact pin being inserted into the hole and, attendant therewith, the base film splits and, depending on the case, the contact pin may adversely pass through the electrode pattern and the base film. Furthermore, there is a problem in that the process becomes complicated because the hole diameter is made narrower than the diameter of the contact pin so that the contact pin to be inserted does not lack stability, and therefore, when the contact pin is to be inserted, the contact pin must be pressed in while imparting ultrasonic vibration to the contact pin and while softening the molded resin of the hole part with which the circumference of the pin makes contact.

Accordingly, an object of the present invention is to solve the aforementioned problems in the conventional art and to provide an injection molded product that sufficiently electrically connects a contact pin and an electrode pattern, and a method of manufacturing the same.

An injection molded product according to a first aspect of the invention comprises: a base film;
  an electrode pattern formed on the base film;
  an electrically conductive adhesive formed on an upper surface of the electrode pattern;
  an electrically contact pin in contacts with the electrically conductive adhesive, is the contact pin being electrically connected to the electrode pattern via the electrically conductive adhesive; and
  a molded resin, which is injection molded along the base film such that the electrically conductive adhesive and part of the contact pin are embedded therein.

In the injection molded product according to the first aspect of the invention, the electrically conductive adhesive preferably comprises an electrically conductive filler, a binder, and a solvent; and the binder preferably is a thermoplastic resin.

In the injection molded product according to the first aspect of the invention, the electrically conductive adhesive preferably is formed such that a portion in contact with the contact pin is built up in a mountain shape; and a thickness of the electrically conductive adhesive from an upper surface of the electrode pattern to a mountain peak of the electrically conductive adhesive preferably is in the range of 3%-30% of a thickness of the molded resin.

In the injection molded product according to the first aspect of the invention, a pin surface of the contact pin may be provided with a matted unevenness or an annular knurled groove.

In the injection molded product according to the first aspect of the invention, the contact pin may be a contact pin wherein a tapered part, which tapers toward the pin tip in contact with the electrically conductive adhesive, is provided.

In the injection molded product according to the first aspect of the invention, the contact pin may be a contact pin that comprises a pin tip part wherein the pin tip, in contact with the electrically conductive adhesive, is enlarged in a radial direction.

In the injection molded product according to the first aspect of the invention, the contact pin may be a contact pin that comprises:
  an annular knurled groove, which is provided diagonally to pin axial direction on a pin surface; and
  an concave-convex part, which is provided on a circumferential part of a pin tip in contact with the electrically conductive adhesive, the concave-convex part being formed as a result of the arrangement of the knurled groove.

An injection molded product manufacturing method according to a second aspect of the present invention comprises:

preparing an injection molding mold that includes a fixed mold and a movable mold, which is capable of being in contact with and separating from the fixed mold;

mounting, on an inner surface of the movable mold, a base film whereon an electrode pattern and an electrically conductive adhesive are provided;

disposing, on an inner surface of the fixed mold, a contact pin that is electrically conductive;

closing the movable mold and the fixed mold such that the electrically conductive adhesive on the movable mold and the contact pin on the fixed mold are in contact with;

forming a molded resin by injecting a resin melt into a cavity part formed between the movable mold, whereon the base film is mounted, and the fixed mold, bringing the surfaces of the electrically conductive adhesive and the contact pin into close contact with the resin melt, and cooling and solidifying such; and opening the fixed mold and the movable mold and ejecting the injection molded product, which comprises: the base film; the electrode pattern formed on the base film; the electrically conductive adhesive formed on an upper surface of the electrode pattern; the contact pin being in contact with the electrically conductive adhesive and electrically connected to the electrode pattern via the electrically conductive adhesive; and the molded resin injection molded along the base film such that the electrically conductive adhesive and part of the contact pin are embedded therein.

In the injection molded product manufacturing method according to a second aspect of the present invention, in the step of mounting the base film provided with the electrode pattern and the electrically conductive adhesive on the inner surface of movable mold, the electrically conductive adhesive preferably is dried.

In the injection molded product manufacturing method according to a second aspect of the present invention, in the step of injecting the resin melt the electrically adhesive is an electrically conductive adhesive that deforms due to the heat and pressure of the resin melt preferably.

In an electronic apparatus that uses an injection molded product according to a third aspect of the present invention, the injection molded product according to the first aspect of the invention is used.

According to the injection molded product and the method of manufacturing the same according to the present invention, the electrically conductive adhesive is present between the contact pin and the electrode pattern, which makes it possible to reliably make the electrical connection between the contact pin and the electrode pattern. In addition, because there are no steps of ultrasonic pressing and the like as in outsert molding and because volatilizing the solvent in the electrically conductive adhesive and drying the electrically conductive adhesive do not take up time, the number of manufacturing steps and the lead time can be reduced. As a result, it is possible to manufacture the injection molded product at low cost without the base film dissolving owing to the action of the solvent in the electrically conductive adhesive and without abnormalities in the external appearance generated by swelling and the like. Furthermore, because a hole is not provided in the molded resin, there is no swelling at the spot corresponding to the portion of the hole owing to the shrinkage differential between the base film and the molded resin at the hole peripheral part, which makes it possible to obtain a satisfactory external appearance. In addition, because there is no insertion of the contact pin after formation, it is possible to prevent the problems of pin traces remaining in the electrode pattern and the base film, of the base film splitting, and, depending on the case, of the contact pin passing through the electrode pattern and the base film.

BRIEF DESCRIPTION OF THE DRAWINGS

FIG. 5(a) is a plan view that shows one example of the surface shape of the contact pin of the injection molded product according to the first embodiment, and FIG. 5(b) is a plan view that shows a separate example of the surface shape of the contact pin;

FIG. 6(a) is a plan view that shows a separate example of the surface shape of the contact pin of the injection molded product according to the first embodiment, and FIG. 6(b) is an oblique view that shows a separate example of a tip shape of the contact pin;

DETAILED DESCRIPTION OF EMBODIMENTS

Figure 1:
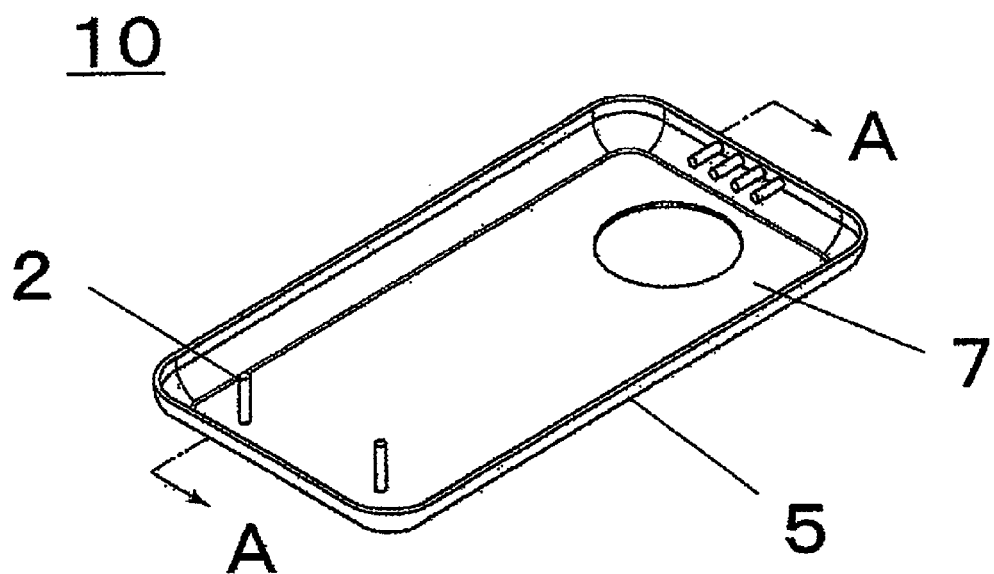
FIG. 1 is an oblique view that shows an injection molded product according to a first embodiment.

An injection molded product and a method of manufacturing the same according to the present invention are explained below, with reference to the attached drawings. Furthermore, elements in the drawings that are substantially identical are assigned identical symbols.

(First Embodiment)
<Injection Molded Product>

Figure 2:
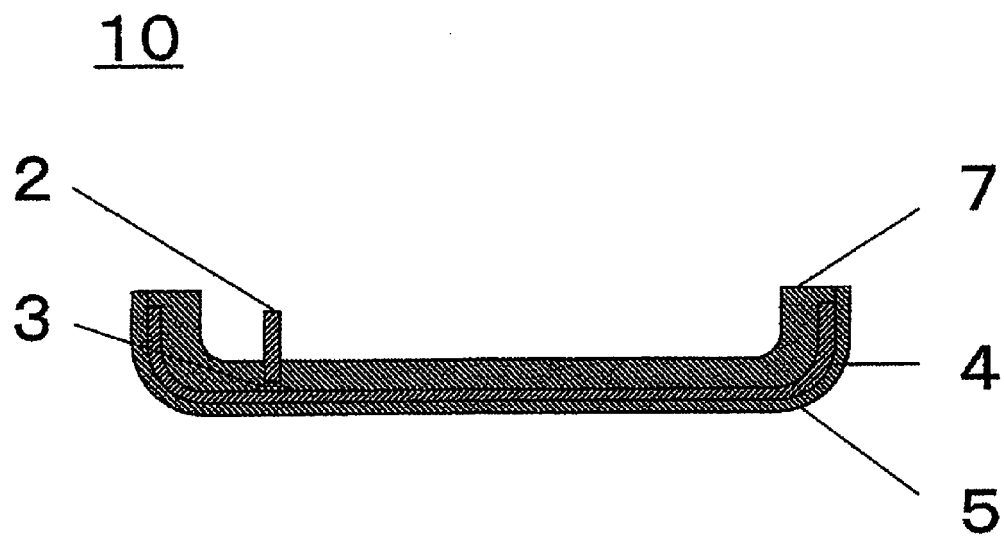
FIG. 2 is a cross sectional view taken along the A-A line of the injection molded product in FIG. 1.

FIG. 1 is an oblique view that shows an injection molded product 10 according to a first embodiment of the present invention. FIG. 2 is a cross sectional view taken along the A-A line of the injection molded product 10 in FIG. 1. The injection molded product 10 according to the first embodiment shown in FIG. 1 and FIG. 2 comprises contact pins 2, an electrically conductive adhesive 3, an electrode pattern 4, a base film 5, and a molded resin 7. Furthermore, in addition to the abovementioned configuration, there may also be an insulative layer, a shield layer, a peel-off layer that protects the surface from scratches, a design layer that expresses a design, an anchor layer that improves adhesion to the molded resin 7, and the like.

Figure 3:
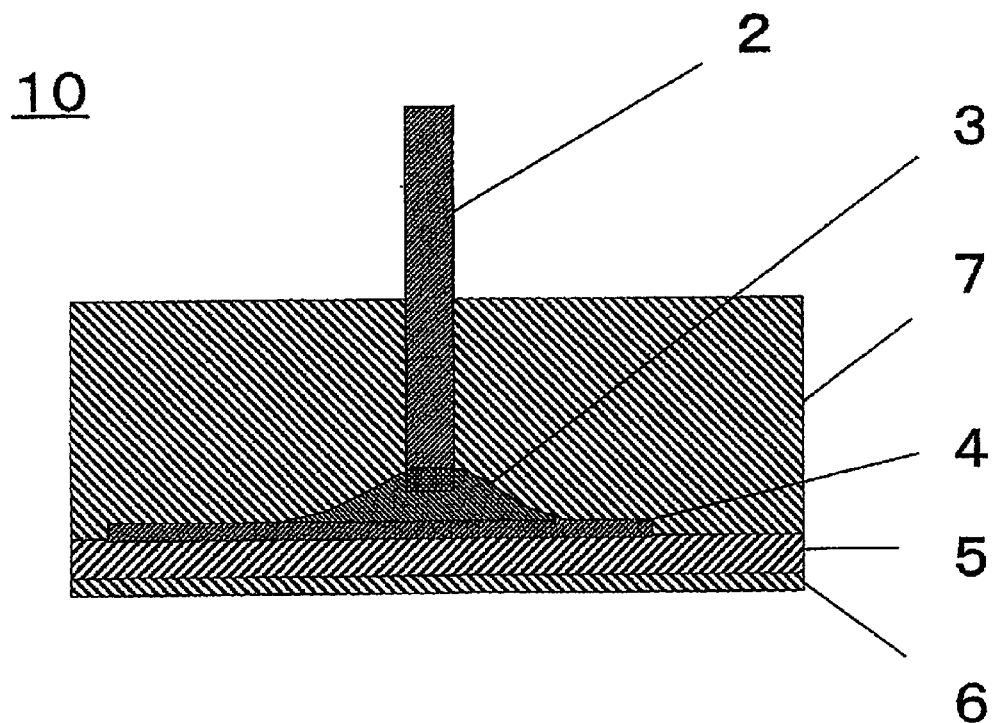
FIG. 3 is an enlarged cross sectional view that shows the configuration of the injection molded product according to the first embodiment.

FIG. 3 is an enlarged cross sectional view that shows the configuration of the injection molded product 10 according to the first embodiment. The injection molded product 10 is provided with: the base film 5; the electrode pattern 4, which is formed on the base film 5; the electrically conductive adhesive 3, which is formed on an upper surface of the electrode pattern 4; the contact pin 2, which is in contact with the conductive adhesive 3, is electrically conductive and is electrically connected to the electrode pattern 4 via the electrically conductive adhesive 3; and the molded resin 7, which is injection molded along the base film 5 such that the electrically conductive adhesive 3 and a part of the contact pin 2 are embedded therein. Furthermore, FIG. 3 shows, as one example, a structure for a case wherein a design layer 6 is provided.

According to the abovementioned configuration, the contact pin 2, which is made of an electrically conductive material, and the electrode pattern 4 are electrically connected via the electrically conductive adhesive 3. In addition, the molded resin 7 is in close contact with the surface of part of the contact pin 2 and the surface of the electrically conductive adhesive 3. Furthermore, in the present injection molded product 10, the electrode pattern 4 may be a two dimensional pattern. Alternatively, the electrode pattern 4 may be a three dimensional pattern.

In the injection molded product 10, an electrical connection can be reliably made between the contact pin 2 and the electrode pattern 4 by the electrically conductive adhesive 3, as described above. In addition, because the molded resin 7 is in close contact with the surface of part of the contact pin 2 and the surface of the electrically conductive adhesive 3, the contact pin 2 can be fixed more securely than in the case of outsert molding.

Furthermore, because a hole is not provided in the molded resin 7 as in the case of outsert molding, it is possible to obtain a satisfactory external appearance without the spot corresponding to the portion of the hole swelling owing to the shrinkage differential between the base film 5 and the molded resin 7 at a peripheral part of the hole. In addition, because the contact pin 2 is not inserted after molding, it is possible to prevent the problems such as pin traces remaining in the electrode pattern 4 and the base film 5, the base film 5 splitting, and, depending on the case, the contact pin 2 passing through the electrode pattern 4 and the base film 5.

Next, the elements that constitute the injection molded product 10 will be explained.

<Contact Pin>

The contact pin 2 is made of an electrically conductive material. For example, materials such as copper, brass, phosphor bronze, iron, stainless steel, or the like can be used therefor. The outer diameter is preferably 0.2-2.0 mm. It is more preferably 0.4-1.0 mm.

Figure 4A:
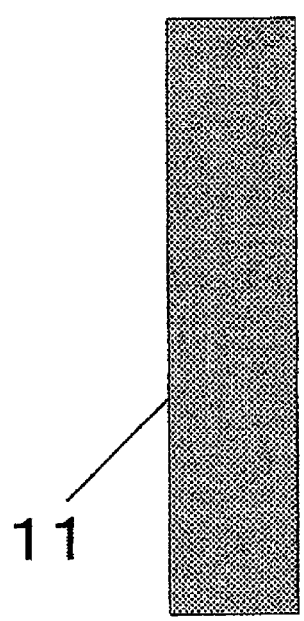
FIG. 4(a) is a plan view that shows one example of the surface shape of a contact pin of the injection molded product according to the first embodiment.
Figure 4B:
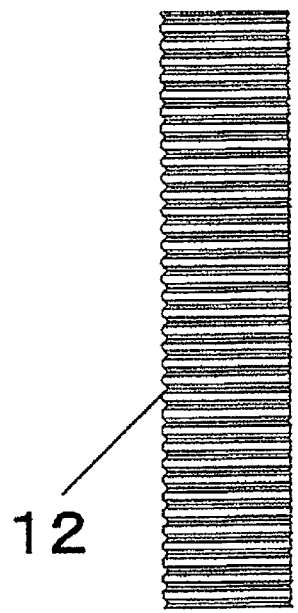
FIG. 4(b) is a plan view that shows a separate example of the surface shape of the contact pin.

FIG. 4(a) is a plan view that shows one example of a surface shape of the contact pin 2 of the injection molded product 10 according to the first embodiment of the present invention, and FIG. 4(b) is a plan view that shows a separate example of the surface shape of the contact pin 2. As shown in FIG. 4(a), the contact pin 2 may be a contact pin 11, wherein the pin surface is provided with a matted unevenness. In addition, as shown in FIG. 4(b), the contact pin 2 may be a contact pin 12 wherein the pin surface is provided with annular knurled grooves. By providing unevenness, grooves, or the like in the pin surface, the molded resin 7 enters and solidifies in the unevenness, the grooves, or the like of the pin surface, and consequently it is difficult for the contact pin 2 to come out from the molded resin 7.

FIG. 5(a) is a plan view that shows one example of the surface shape of the contact pin 2 of the injection molded product 10 according to the first embodiment, and FIG. 5(b) is a plan view that shows a separate example of the surface shape of the contact pin 2. As shown in FIG. 5(a), the contact pin may be a contact pin 13 wherein a tapered part that tapers toward a pin tip is provided. Providing the tapered part on the pin tip makes it easier for the pin tip of the contact pin 2 to intrude into the electrically conductive adhesive 3, which stabilizes the contact between the contact pin 2 and the electrically conductive adhesive 3. In addition, as shown in FIG. 5(b), the contact pin may be a contact pin 14 that has a pin tip part where the pin tip is enlarged in a radial direction. Examples of shapes of the tip part of the contact pin 14 include a substantially cylindrical shape, a substantially discoidal shape, and a substantially inverse conical shape (not shown). In the contact pin 14, the large-diameter pin tip part serves as a separation stop that prevents separation from the molded resin 7. Therefore it is difficult for the contact pin 14 to come out from the molded resin 7 even if the pin shape is not provided with unevenness, knurled grooves, or the like.

FIG. 6(a) is a plan view that shows a separate example of the surface shape of the contact pin 2 of the injection molded product 10 according to the first embodiment of the present invention, and FIG. 6(b) is an oblique view that shows a separate example of the tip shape of the contact pin 2. As shown in FIG. 6(a) and FIG. 6(b), the contact pin 2 may be a contact pin 15 wherein the pin surface is provided with knurled grooves 16 diagonal to the pin axial direction and a circumferential part of the pin tip is provided with an concave-convex part 17. By providing the knurled grooves 16 in the pin surfaces as described above, it becomes difficult for the pin to come out from the molded resin. In addition, by providing the concave-convex part 17 in the circumferential part of the pin tip, the electrically conductive adhesive 3 enters the concave-convex part 17, and thereby a reliable contact with the contact pin 2 can be formed.

<Electrically Conductive Adhesive>

The electrically conductive adhesive 3 comprises an electrically conductive filler, a binder, and a solvent. Gold, silver, copper, aluminum, nickel, carbon, or graphite can be used as the electrically conductive filler; alternatively, an electrically conductive powder made by plating the surfaces of urethane particles, silica, or the like with a metal such as copper, nickel, or silver can be used as the electrically conductive filler. In addition, various thermoplastic resins, such as a polyester resin, an acrylic resin, a polyvinyl chloride-polyvinyl acetate copolymer resin, a polyvinyl chloride-polyvinyl acetate-maleic acid copolymer resin, a rosin based resin, a rosin ester based resin, or a petroleum resin, can be used as the binder; in addition, the resin may be made into a paste by dissolving it in a suitable solvent and may be coated by screen printing or by using a dispenser.

Figure 7:
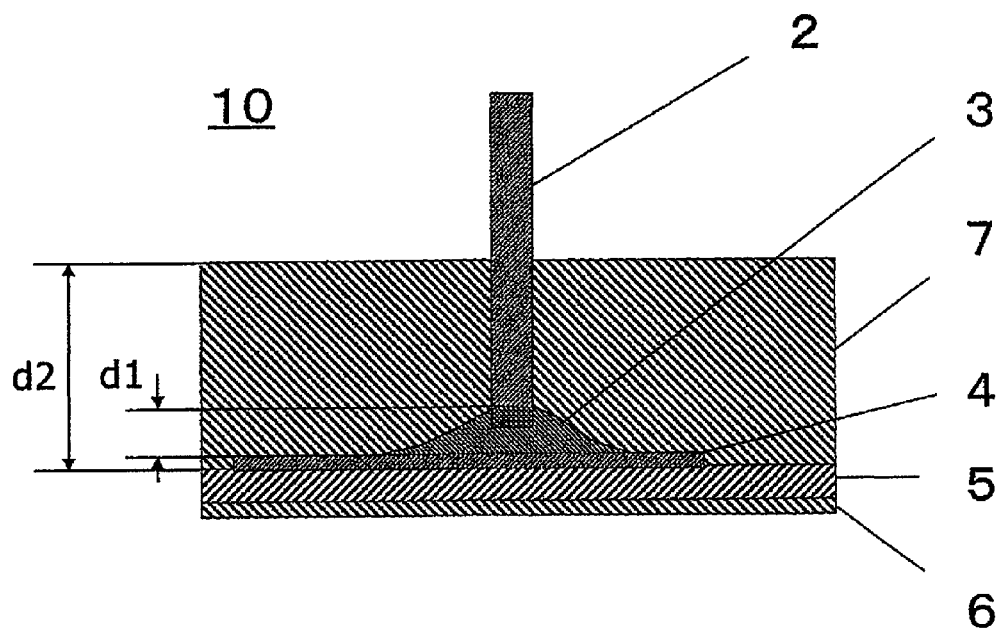
FIG. 7 is a cross sectional view that shows the thickness of the electrically conductive adhesive of the injection molded product according to the first embodiment.

FIG. 7 is a cross sectional view that shows a thickness d1 of the electrically conductive adhesive 3 of the injection molded product 10 according to the first embodiment of the present invention. As shown in FIG. 7, the electrically conductive adhesive 3 is formed such that the portion in contact with the contact pin 2 is built up into a mountain shape; furthermore, the thickness d1 from the upper surface of the electrode pattern 4 to the mountain peak of the electrically conductive adhesive 3 is preferably within the range of 3%-30% of a thickness d2 of the molded resin 7. This is because, if the thickness d1 of the electrically conductive adhesive 3 is too large, the flow resistance will become large when a resin melt 8 is being injected, and thereby the electrically conductive adhesive 3 will adversely be swept away by the resin melt 8. In addition, if the thickness d1 of the electrically conductive adhesive 3 is too small, the electrical connection between the contact pin 2 and the electrode pattern 4 will become unstable.

Furthermore, a hot melt electrically conductive adhesive may be used wherein one of the abovementioned thermoplastic resins is thermally fused instead of using the solvent and the electrically conductive filler has been dispersed. Because the hot melt electrically conductive adhesive does not contain a solvent, it is solid or semisolid at room temperature, and consequently if the hot melt electrically conductive adhesive is hot melted during the injection of the resin melt 8 and then cooled and solidified, the hot melt electrically conductive adhesive can be adhered without the need to dry the electrically conductive adhesive.

<Electrode Pattern>

The electrode pattern may be formed by screen printing or gravure printing using an electrode pattern ink. In addition, the electrode pattern may be formed as a metal vapor deposited film.

<Electrode Pattern Ink>

The electrode pattern ink contains an electrically conductive filler and a binder. Gold, silver, copper, aluminum, nickel, carbon, or graphite can be used as the electrically conductive filler; alternatively, a powder made by plating the surface of urethane particles or silica with copper, nickel, or silver can be used as the electrically conductive filler. In addition, a polyester resin, an acrylic resin, a polyvinyl chloride-polyvinyl acetate copolymer resin, or a polyvinyl chloride-polyvinyl acetate-maleic acid copolymer resin can be used on its own or in a mixture as the binder; alternatively, an ink can be used wherein a thermoplastic resin, such as the mono-component resin or the mixed resin, is dissolved by a solvent suited to a printing method such as screen printing, gravure printing, flexography, or the like. Furthermore, an epoxy based, a urethane based, or an acrylic based thermosetting resin/UV setting type resin can be used as the binder.

<Metal Vapor Deposited Film>

The electrode pattern layer may be a metal vapor deposited film of aluminum, copper, or the like, and may be formed by etching aluminum or copper foil laminated to a base film.

<Base Film>

For example, a polyester resin film, an acrylic resin film, a polycarbonate resin film, PBT resin film, a styrene resin film, ABS resin film, a multilayer film of an acrylic resin and ABS resin, a multilayer film of an acrylic resin and a polycarbonate resin, or the like can be used as the material of the base film 5.

<Design Layer>

The design layer 6 may be provided in order to embellish the external appearance of the injection molded product 10. In addition, as the material of the design layer 6, an ink can be used wherein a thermosetting resin, a UV setting resin, a thermoplastic resin, or the like, such as a urethane resin, an acrylic urethane resin, a polyesterurethane resin, an acrylic resin, a polyvinyl chloride-polyvinyl acetate copolymer resin, or the like, serves as a binder. Furthermore, in addition to the design layer 6, a layer such as an insulative layer, a shield layer, a peel-off layer, an adhesive layer, an anchor layer, or the like may be provided.

<Molded Resin>

The molded resin 7 may be transparent, semitransparent, or nontransparent. In addition, the molded resin 7 may be colored or not colored. A general purpose resin, such as a polystyrene based resin, a polyolefin based resin, ABS resin, AS resin, or AN resin, can be given as examples of the resin of the molded resin 7. In addition, a polycarbonate based resin, a polyacetal based resin, an acrylic resin, a polyethylene terephthalate based resin, a polybutylene terephthalate based resin, or a super-engineering resin (e.g., a polysulfone resin, a polyphenylene sulfide based resin, a polyphenylene oxide based resin, or a polyacrylate resin) are examples of other resins that can be used as the resin of the molded resin 7. Furthermore, a composite resin to which a reinforcing material such as glass fibers or an inorganic filler has been added can also be used as the resin of the molded resin 7.

(Second Embodiment)

Next, a method of manufacturing the injection molded product 10 according to the second embodiment will be explained, with reference to FIGS. 8(a)-(d). FIGS. 8(a)-(d) include cross sectional views that show each step of the method of manufacturing the injection molded product 10 according to the second embodiment of the present invention.

Figure 8A:
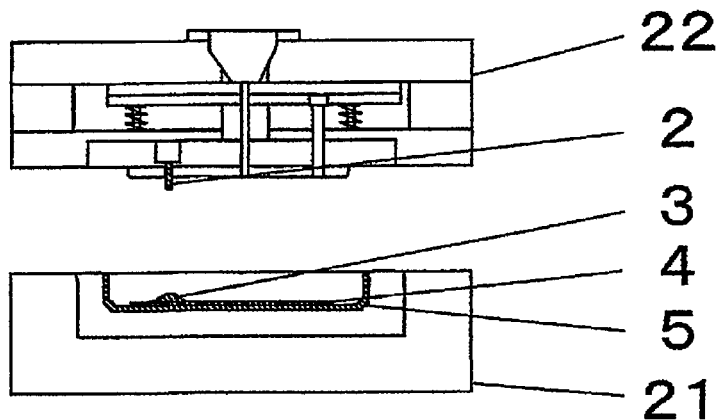
FIGS. 8(a)-(d) are cross sectional views that show each step of an injection molded product manufacturing method according to a second embodiment.

(1) Prepare an injection molding mold, which comprises a fixed mold 22 and a movable mold 21 that is capable of being in contact with and separating from the fixed mold 22 (FIG. 8(a)).

(2) Mount the base film 5, on which the electrode pattern 4 and the electrically conductive adhesive 3 have been provided, on an inner surface of the movable mold 21 (FIG. 8(a)). It is preferable to dry the electrically conductive adhesive 3. In addition, the electrically conductive adhesive 3 may be an electrically conductive adhesive that comprises the electrically conductive filler, the binder, and the solvent. And it is preferable to use an electrically conductive adhesive wherein the binder is a thermoplastic resin. Furthermore, the thickness d1 of the electrically conductive adhesive 3 is preferably in the range of 3%-30% of the thickness d2 of the molded resin 7. A hot melt electrically conductive adhesive may be used as the electrically conductive adhesive 3. Furthermore, the design layer 6 for embellishing the external appearance of the injection molded product 10 may be provided on the lower side of the base film 5 and, in addition, there may be an insulative layer, a shield layer, a peel-off layer, an anchor layer, or the like.

(3) Dispose the electrically conductive contact pin 2 on the inner surface of the fixed mold 22 (FIG. 8(a)). The contact pin 11, wherein the pin surface is provided with the matted unevenness, may be used as the contact pin 2 (FIG. 4(a)), or the contact pin 12, wherein the pin surface is provided with the annular knurled grooves, may be used as the contact pin 2 (FIG. 4(b)). In addition, the contact pin 13, wherein the pin tip part is provided with a tapered part that tapers toward the pin tip, or the contact pin 14, which has a pin tip part where the pin tip is enlarged in a radial direction, may be used (FIG. 5(a) and FIG. 5(b)). Furthermore, the contact pin 15 that includes the annular knurled grooves, which are provided in the pin surface and diagonal to the pin axial direction, and the concave-convex part, which is formed, as a result of the arrangement of the knurled grooves, on the circumferential part of the pin tip in contact with the electrically conductive adhesive 3, may be used (FIG. 6).

Figure 8B:
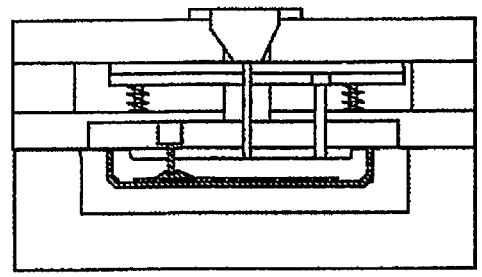

(4) Close the movable mold 21 and the fixed mold 22 such that the electrically conductive adhesive 3 on the movable mold 21 and the contact pin 2 disposed on the inner surface of the fixed mold 22 are in contact (FIG. 8(b)). When closing, the tip part of the contact pin 2 is inserted, while being strongly pushed, into the surface of the electrically conductive adhesive 3, and therefore a state results wherein compressive stress remains in the electrically conductive adhesive 3 directly below the pin and the electrically conductive adhesive 3 is pushed upward along the circumference of the contact pin 2.

Figure 8C:
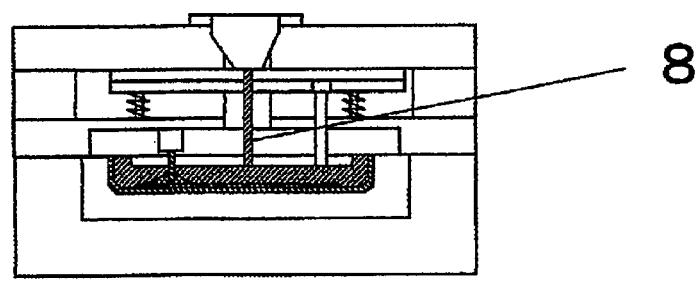

(5) Inject the resin melt 8 into a cavity part formed between the movable mold 21, whereon the base film 5 is mounted, and the fixed mold 22, and then bring the surface of the electrically conductive adhesive 3 and the surface of the contact pin 2 into close contact with the resin melt 8, and then cool and solidify such to form the molded resin 7 (FIG. 8(c)). During the injection of the resin melt 8, the electrically conductive adhesive 3 softens and deforms owing to the heat and the pressure of the resin melt 8, and therefore the compressive stress described above relaxes. Furthermore, the electrically conductive adhesive 3 pushed up along the circumference of the contact pin 2 adheres to the contact pin 2 such that it covers the periphery of the tip part of the contact pin 2, which increases the degree of adhesion between the electrically conductive adhesive 3 and the contact pin 2.

Figure 8D:
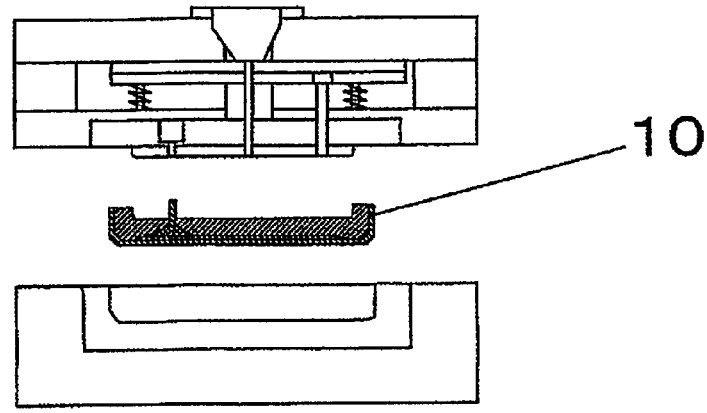

(6) Open the movable mold 21 and the fixed mold 22 and eject the injection molded product 10 (FIG. 8(d)), which comprises: the base film 5; the electrode pattern 4, which is formed on the base film 5; the electrically conductive adhesive 3, which is formed on the upper surface of the electrode pattern 4; the contact pin 2, which is in contact with the electrically conductive adhesive 3 and is electrically connected to the electrode pattern 4 via the electrically conductive adhesive 3; and the molded resin 7, which is injection molded along the base film 5 such that the electrically conductive adhesive 3 and a part of the contact pin 2 are embedded therein.

Based on the above, the injection molded product 10 can be obtained.

According to the present method of manufacturing the injection molded product 10, the electrically conductive adhesive 3 is present between the contact pin 2 and the electrode pattern 4, which makes it possible to reliably make the electrical connection between the contact pin 2 and the electrode pattern 4. Furthermore, because the molded resin 7 is in close contact with the surface of the electrically conductive adhesive 3 and the surface of the contact pin 2, the contact pin 2 can be fixed more securely than in outsert molding.

In addition, because there are no steps of ultrasonic pressing and the like as in outsert molding and because volatilizing the solvent in the electrically conductive adhesive 3 and drying the electrically conductive adhesive 3 do not take up time, the number of manufacturing steps and the lead time can be reduced. As a result, it is possible to manufacture the injection molded product 10 at low cost without the base film 5 dissolving owing to the action of the solvent in the electrically conductive adhesive 3 and without abnormalities in the external appearance generated by swelling and the like. Furthermore, because a hole is not provided in the molded resin 7, there is no swelling at the spot corresponding to the portion of a hole owing to the shrinkage differential between the base film 5 and the molded resin 7 at the hole peripheral part, which makes it possible to obtain a satisfactory external appearance. In addition, because there is no pressing-in of the contact pin 2, it is possible to prevent the problems of pin traces remaining in the electrode pattern 4 and the base film 5, of the base film 5 splitting, and, depending on the case, of the contact pin 2 passing through the electrode pattern 4 and the base film 5.

If the electrically conductive adhesive 3 is dried in the step (2) of the abovementioned manufacturing method, then, in the step (5) of the abovementioned manufacturing method, when the resin melt 8 is being injected, the electrically conductive adhesive 3 has already adhered to the electrode pattern 4, which is provided on the base film 5, and therefore the electrically conductive adhesive 3 does not get washed away by the resin melt 8. As a result, even if the contact pin 2 is inserted simultaneously with the injection molding, the electrical connection between the contact pin 2 and the electrode pattern 4 can be reliably made by the electrically conductive adhesive 3.

In addition, in the step (5) of the abovementioned manufacturing method, the electrically conductive adhesive 3 adheres to the contact pin 2 such that it covers the periphery of the tip part of the contact pin 2. The electrically conductive adhesive 3 that has been solidified during the injection of the resin melt 8 deforms owing to the heat and the pressure of the resin melt 8. The electrically conductive adhesive, which serves as the electrically conductive adhesive 3 and which deforms owing to the heat and the pressure of the resin melt 8, is an electrically conductive adhesive that, for example, comprises the electrically conductive filler, the binder, and the solvent. Furthermore, an electrically conductive adhesive, wherein the binder is a thermoplastic resin, a hot melt electrically conductive adhesive, or the like may be used. As a result, the degree of adhesion between the electrically conductive adhesive 3 and the contact pin 2 increases, which improves continuity. Furthermore, the contact pin 11, which is provided with the matted unevenness; the contact pin 12, which is provided with the annular knurled grooves; the contact pin 13, which is provided with the tapered part; the contact pin 14, which has a pin tip part where the pin tip is enlarged in a radial direction; and the contact pin 15, which is provided with the diagonal knurled grooves, all of which are shown in FIGS. 4-6, can be used. When any of the contact pins 11, 12, 13, 14, 15 is used, the electrically conductive adhesive 3 will enter either the grooves in the pin surface and the tip part or the concave-convex part, thereby making it possible to form a more reliable contact. In addition, by virtue of the molded resin 7 entering the unevenness or the grooves of the pin surface or by virtue of making the pin tip part such that the pin tip is enlarged in a radial direction, it becomes difficult for the contact pin 2 to come out of the molded resin 7.

Examples of electronic devices that can use the injection molded product 10 include a smart phone, a tablet computer PC, a portable music player, a mobile phone, an electronic book reader, and an IC recorder.

Furthermore, in each of the embodiments mentioned above, the contact pin 2 has an oblong cylindrical shape; however, the contact pin 2 may have another shape, such as a flat plate shape, as long as one end is in contact with the electrically conductive adhesive formed on the upper surface of the electrode pattern, is electrically connected to the electrode pattern via the electrically conductive adhesive, and is electrically conductive.

Figures 9A, 9B, 9C:
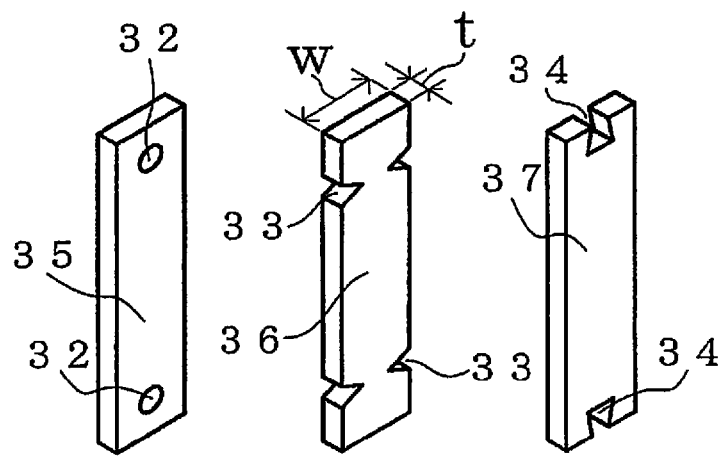
FIG. 9 includes oblique views that show other embodiments of the contact pin.

With reference to FIG. 9(a), a contact pin 35 has a flat plate shape that extends like a strip shape, and circular openings 32 are formed at the centers of both ends thereof, one opening 32 at each end. With regard to the material properties of the contact pin 35, the contact pin 35 may be made of the same electrically conductive material as the contact pin 2, and it is preferable to use one that, for example, has a plate thickness t of 0.05-2 mm and a plate width w of 1-8 mm. Furthermore, it is preferable to use one wherein, for example, the plate thickness t is 0.15-1 mm and the plate width w is 1.5-4 mm. If the plate thickness is too small, undesirable deformation tends to occur, such as the contact pin 35 bending owing to the resin pressure during the injection molding of the molded resin 7; furthermore, if the plate thickness is too large, strain arises in the portion of the front surface of the molded resin 7 where the contact pin 35 is disposed, which tends to be disadvantageous from the viewpoint of the design of the external appearance. If the plate thickness is too large and secondary processing were to be performed that bends the tip of the contact pin, the contact pin would adversely be difficult to bend. If the plate width is too small, then the same phenomenon that arises when the plate thickness is too small tends to occur; furthermore, if the plate width is too large, a large resin pressure impinges during the injection molding of the molded resin 7, and deformation owing to the resin pressure tends to occur. The size of the contact pin 35 may be appropriately selected in accordance with the product, such as a smart phone or a tablet computer PC, and the configuration of the components inside the product to which an injection molded product 40 is adapted.

Figure 10:
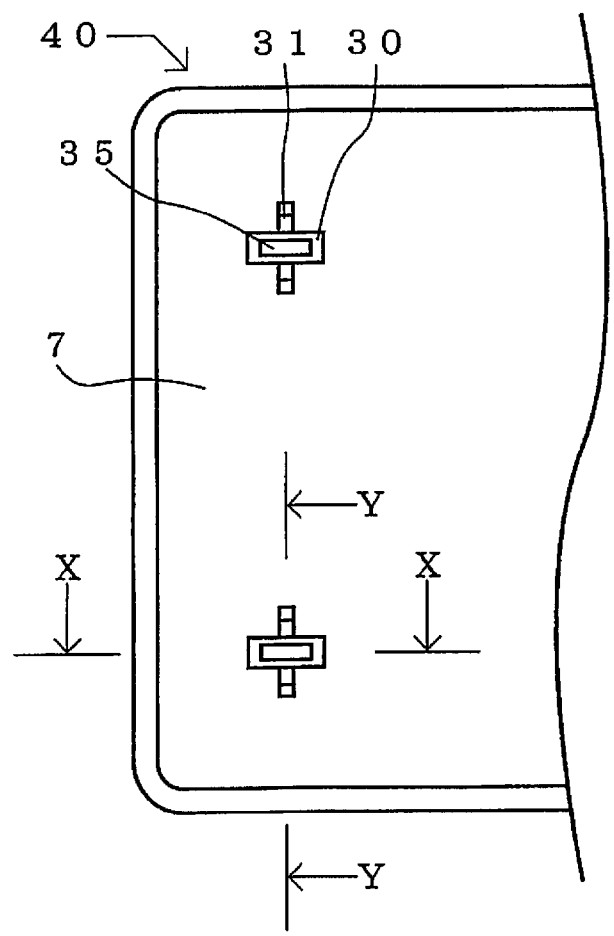
FIG. 10 is a partial plan view that shows a schematic configuration of another disclosed embodiment.
Figure 11A:
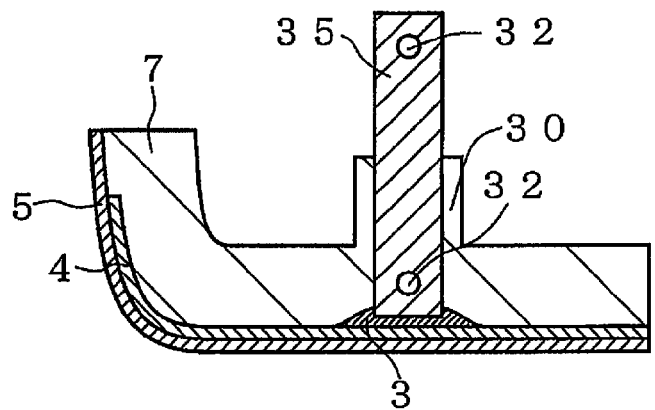
FIG. 11(a) is a cross sectional view taken along the X-X line shown in FIG. 10.
Figure 11B:
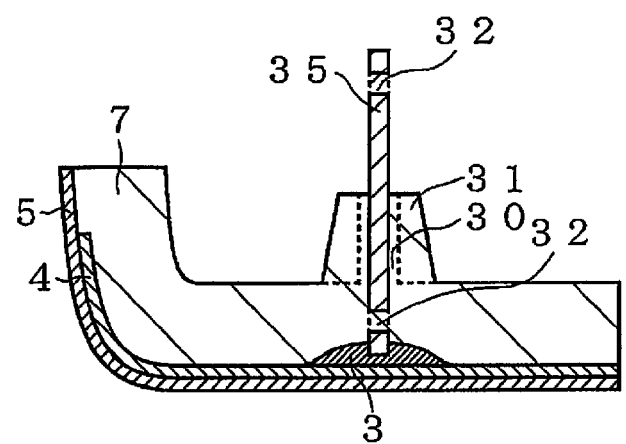
FIG. 11(b) is a cross sectional view taken along the Y-Y line shown in FIG. 10.
Figure 11C:
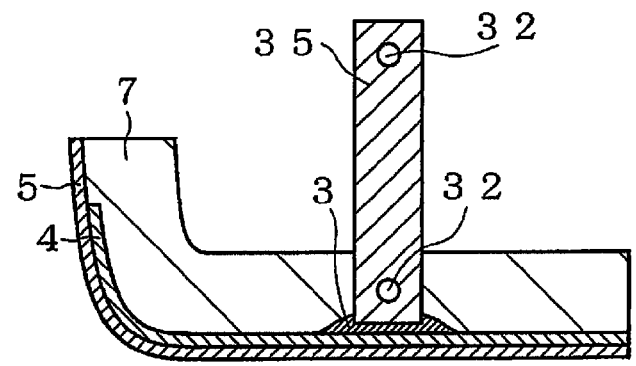
FIG. 11(c) is a cross sectional view of another embodiment corresponding to FIG. 11(a).

With reference to FIG. 10 and FIGS. 11(*a*), (*b*), the basic configuration is common to the injection molded product 40 and the injection molded product 10, and consequently the explanation of the injection molded product 40 will focus on aspects of the configuration that differ from those of the injection molded product 10. In the injection molded product 10, the contact pin 2 has a cylindrical shape; however, in the injection molded product 40, as described above, the contact pin 35 has an oblong flat plate shape, one end of which is caused to make contact with the electrically conductive adhesive, the opening 32 at that one end is embedded in the molded resin 7, the other end of which sticks out from the molded resin 7 and is fixed such that it extends like a strip shape from the base film 5 in an orthogonal direction. In the exposed contact pin 35, a support part 30, which is a part of the molded resin 7, is formed such that it integrally rises along outer perimetric surfaces of the contact pin 35 from the upper surface of the molded resin 7 to a prescribed height. The support part 30 constitutes a reinforcing member. Furthermore, flat plate shaped ribs 31 are formed as parts of the molded resin 7 on rising surfaces on the long edge sides of the support part 30, and these ribs 31 integrally rise such that they are orthogonal to the rising surfaces on the long edge sides of the support part 30 and such that their widths get narrower as they go upward from the upper surface of the molded resin 7 to the upper surface of the support part 30. When the ribs 31 are formed, they are formed integrally with the support part 30, and the support part 30 and the ribs 31 constitute reinforcing members that are formed such that they rise integrally from the upper surface of the molded resin 7. Because the molded resin 7 fills the openings 32 of the contact pin 35 embedded in the molded resin 7, the provision of those openings 32 makes it possible to make the contact pin 35 difficult to come out from the molded resin 7, even if pulled, and to make it difficult to punch through to the surface side of the injection molded product 40, even if pushed. The openings 32 are formed on both ends of the contact pin 35, but the opening 32 does not have to be formed on the end part of the contact pin 35 on the side that sticks out from the molded resin 7. If the openings 32 are formed on both ends of the contact pin 35 and in a shape such that two ends of the contact pin are symmetrical, it is acceptable to embed into the molded resin 7 either end part of the contact pin 35, which simplifies the manufacture of the injection molded product 40. In FIG. 11(*a*), the contact pin 35 can be fixed more rigidly if an additional opening 32 is formed at the portion covered by the support part 30 so that two of the openings 32 are lined up in the axial direction inside the molded resin 7. The support part 30 is formed, in a plan view, in a ring shape along the outer perimetric surface of the contact pin 35; however, it may be formed as long as the fixation degree of the contact pin 35 is increased, for example, in a C-shape or the like wherein, in a plan view, there is a portion at which part of the support part 30 does not exist.

The injection molded product 40 comprises the support part 30 and the ribs 31, which improve the strength, the resistance to bending deformation, and the like of the contact pin 35 in the horizontal direction, and thereby enables the contact pin 35 to be fixed to the molded resin 7 in a more stabilized state. With reference to FIG. 11(*c*), the contact pin 35 may be made to rise with one end independently embedded in the molded resin 7 without configuring the support part 30 and the ribs 31. Alternatively, the support part 30 in FIGS. 11(*a*), (*b*) may be configured alone, without the ribs 31. In addition, in the injection molded product 10 of the previous embodiments wherein the cylindrical contact pin 2 is used, a support part, ribs, or the like the same as the support part 30 and the ribs 31 of the injection molded product 40 may be formed in order to more stably fix the contact pin 2.

The openings 32 are formed at both ends of the contact pin 35, but the openings 32 may have some other shapes. For example, with reference to FIG. 9(*b*), a contact pin 36 has a flat plate shape that extends like a strip shape and, instead of the openings 32, triangular notches 33 are formed on the two long edges on both ends of the contact pin 36 such that the vertexes of the notches 33 face inward. With reference to FIG. 9(*c*), a contact pin 37 has a flat plate shape that extends like a strip shape and, instead of the openings 32, trapezoidal notches 34 are formed at the centers of the edges at both ends such that their widths increase inwardly. The notches 33, 34 on one end are embedded in the molded resin 7, which makes it difficult for the contact pins 36, 37 to come out of the molded resin 7. Instead of forming the openings, the notches, or the like only at the ends of the contact pin, three or more of the openings, the notches, or the like may be formed in series from one end to the other end; furthermore, instead of forming the notches on the long edges on both sides, they may be formed on just one side. The number of the openings, the notches, and the like is not limited. The openings 32 and the notches 33, 34 are formed at least at portions of the contact pins 35, 36, 37 that are embedded in the molded resin 7. The shapes, sizes, and positions of the openings, the notches, and the like may be other than those mentioned above as long as it is difficult for the contact pin to come out of the molded resin 7 even when pulled and difficult to punch through to the surface side of the injection molded product even when pushed. Depending on the required drawing strength, the openings and the notches may not be formed at all in the contact pin.

In the injection molded product 40, the contact pin 35 has a flat plate shape; consequently, unlike the cylindrical shape, the component has directionality viewed from the axial direction and has a large surface area, which makes it easy to form an electrical junction with the components to be integrated. In addition, in the contact pin 35, the surface area of contact with the electrically conductive adhesive is larger than that of the cylindrical contact pin 2, which makes it possible to better stabilize the continuity between the electrode pattern 4 and the contact pin 35 and to draw a larger electric current. Furthermore, because the contact pin 35 is a flat plate, it is easy to form the openings, the notches, and the like, which makes it possible to easily improve the drawing strength of the contact pin 35.

The injection molded product and the method of manufacturing the same according to the present invention are useful in the case wherein a contact pin is electrically connected to an electrode pattern. In particular, they are useful in cases wherein, for example, the electrical connection to an electrode pattern—such as an antenna used in a portable terminal, an electrostatic capacitance coupling type electrical power transfer pattern, and the like in recent years—is made with a contact pin.

The invention claimed is:

1. An injection molded product comprising:
    a base film;
    an electrode pattern formed on the base film;
    an electrically conductive adhesive formed on an upper surface of the electrode pattern, the electrically conductive adhesive comprising a binder being a thermoplastic resin;
    an electrically conductive contact pin having one end which has a bottom face transverse to a longitudinal direction of the electrically conductive contact pin, the electrically conductive adhesive contacting the bottom face and an entire perimeter of the electrically conductive contact pin at the one end of the electrically conductive contact pin, the contact pin being electrically connected to the electrode pattern via the electrically conductive adhesive and arranged to rise from the electrode pattern in the longitudinal direction of the electrically conductive contact pin; and
    a molded resin being injection molded along the base film such that the electrically conductive adhesive and a part of the electrically conductive contact pin are embedded in the molded resin and the other end of the electrically conductive contact pin sticks out from the molded resin.

2. The injection molded product according to claim 1, wherein
    the molded resin has a shape along the base film and a constant thickness;
    the electrically conductive adhesive is formed such that a portion where the electrically conductive contact pin rises is in a shape of a mountain; and
    a height of the electrically conductive adhesive from an upper surface of the electrode pattern to a mountain peak of the electrically conductive adhesive is in the range of 3%-30% of the thickness of the molded resin.

3. The injection molded product according to claim 1, wherein
    a pin surface of the electrically conductive contact pin is provided with a matted unevenness.

4. The injection molded product according to claim 1, wherein
    a pin surface of the electrically conductive contact pin is provided with an annular knurled groove.

5. The injection molded product according to claim 1, wherein
    a pin tip of the electrically conductive contact pin in contact with the electrically conductive adhesive is provided with a tapered part.

6. The injection molded product according to claim 1, wherein
    the electrically conductive contact pin comprises a pin tip part where the pin tip, in contact with the electrically conductive adhesive, is enlarged in a radial direction.

7. The electronic apparatus, wherein the injection molded product according to claim 1 is used.

8. The injection molded product according to claim 1, wherein
    the electrically conductive contact pin has a plurality of longitudinal faces each extending in the longitudinal direction of the electrically conductive contact pin, and a portion of each of the plurality of longitudinal faces at the one end of the electrically conductive contact pin form the entire perimeter of the electrically conductive contact pin at the one end.

9. The injection molded product according to claim 8, wherein the electrically conductive contact pin has four longitudinal faces that form the electrically conductive contact pin as a rectangularly shaped electrically conductive contact pin.

10. A injection molded product comprising:
    a base film:
    an electrode pattern formed on the base film;
    an electrically conductive adhesive formed on an upper surface of the electrode pattern, the electrically conductive adhesive comprising a binder being a thermoplastic resin;
    an electrically conductive contact pin having one end contacted with the electrically conductive adhesive, the electrically conductive contact pin being electrically connected to the electrode pattern via the electrically conductive adhesive and arranged to rise from the electrode pattern, and the contact pin comprising:
        an annular knurled groove, which is provided diagonally to pin axial direction on a pin surface; and
        an concave-convex part, which is provided on a circumferential part of a pin tip in contact with the electrically conductive adhesive, the concave-convex part being formed as a result of the arrangement of the knurled groove; and
    a molded resin being injection molded along the base film such that the electrically conductive adhesive and a part of the electrically conductive contact pin are embedded in the molded resin and the other end of the electrically conductive contact pin sticks out from the molded resin.

11. A injection molded product comprising:
    a base film;
    an electrode pattern formed on the base film;
    an electrically conductive adhesive formed on an upper surface of the electrode pattern, the electrically conductive adhesive comprising a binder being a thermoplastic resin;
    an electrically conductive contact pin having one end contacted with the electrically conductive adhesive, the electrically conductive contact pin being electrically connected to the electrode pattern via the electrically conductive adhesive and arranged to rise from the electrode pattern; and
    a molded resin being injection molded along the base film such that the electrically conductive adhesive and a part of the electrically conductive contact pin are embedded in the molded resin and the other end of the electrically conductive contact pin sticks out from the molded resin;
    the electrically conductive contact pin having a flat plate shape, and an opening or a notch is formed in the portion of the contact pin embedded in the molded resin.

12. An injection molded product comprising:
    a base film;
    an electrode pattern formed on the base film;
    an electrically conductive adhesive formed on an upper surface of the electrode pattern, the electrically conductive adhesive comprising a binder being a thermoplastic resin;
    an electrically conductive contact pin having one end contacted with the electrically conductive adhesive, the electrically conductive contact pin being electrically connected to the electrode pattern via the electrically conductive adhesive and arranged to rise from the electrode pattern;
    a molded resin being injection molded along the base film such that the electrically conductive adhesive and a part of the electrically conductive contact pin are embedded in the molded resin and the other end of the electrically conductive contact pin sticks out from the molded resin; and a reinforcing member formed along an outer perimetric surface of the electrically conductive contact pin, rising integrally from the upper surface of the molded resin.

13. The injection molded product manufacturing method comprising:

preparing an injection molding mold that includes a fixed mold and a movable mold, contactable with the fixed mold;

mounting, on an inner surface of the movable mold, a base film whereon an electrode pattern and an electrically conductive adhesive comprising a binder being a thermoplastic resin are provided on the electrode pattern;

disposing, on an inner surface of the fixed mold, a contact pin that is electrically conductive, such that the contact pin is arranged to rise from the inner surface of the fixed mold;

closing the movable mold and the fixed mold such that the electrically conductive adhesive and the contact pin are in contact;

forming a molded resin by injecting a resin melt into a cavity part formed between the movable mold and the fixed mold, softening the electrically conductive adhesive by the heat of the resin melt, bringing the surfaces of the electrically conductive adhesive and the contact pin into close contact with the resin melt, and cooling and solidifying such; and opening the fixed mold and the movable mold and ejecting the injection molded product, which comprises: the base film; the electrode pattern, which is formed on the base film; the electrically conductive adhesive comprising a binder being a thermoplastic resin and formed on an upper surface of the electrode pattern; the contact pin having one end contacted with the electrically conductive adhesive and electrically connected to the electrode pattern via the electrically conductive adhesive and arranged to rise from the electrode pattern; and the molded resin injection molded along the base film such that the electrically conductive adhesive and a part of the contact pin are embedded in the molded resin and the other end of the contact pin sticks out from the molded resin.

14. The injection molded product manufacturing method according to claim 13, wherein in the step of mounting the base film provided with the electrode pattern and the electrically conductive adhesive comprising a binder being a thermoplastic resin are provided on the electrode pattern, the electrically conductive adhesive is dried.

* * * * *